(12) United States Patent
Campini et al.

(10) Patent No.: US 7,450,796 B2
(45) Date of Patent: Nov. 11, 2008

(54) RADIATION SWITCH

(75) Inventors: Edoardo Campini, Mesa, AZ (US);
Steven DeNies, East Aurora, NY (US);
William Handley, Chandler, AZ (US);
Lawson Guthrie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 11/093,650

(22) Filed: Mar. 30, 2005

(65) Prior Publication Data

US 2006/0226239 A1    Oct. 12, 2006

(51) Int. Cl.
G02B 6/26 (2006.01)
H01R 33/945 (2006.01)
G06K 19/06 (2006.01)

(52) U.S. Cl. .............. 385/16; 385/15; 385/17; 385/24; 385/88; 385/89; 385/132; 439/577; 235/492

(58) Field of Classification Search ........ 385/14, 385/15, 16, 17, 18, 19, 24, 49, 129, 130, 385/131, 132, 88, 89, 92; 439/577; 235/492
See application file for complete search history.

(56) References Cited

U.S. PATENT DOCUMENTS

| | | | | |
|---|---|---|---|---|
| 4,774,407 A | * | 9/1988 | Erbe | 250/227.23 |
| 6,009,219 A | * | 12/1999 | Doyle | 385/23 |
| 6,181,847 B1 | * | 1/2001 | Baker et al. | 385/19 |
| 6,859,578 B2 | * | 2/2005 | Riza | 385/18 |
| 7,083,422 B2 | * | 8/2006 | Campini et al. | 439/61 |
| 2005/0227505 A1 | * | 10/2005 | Campini et al. | 439/61 |
| 2006/0226239 A1 | * | 10/2006 | Campini et al. | 235/492 |

OTHER PUBLICATIONS

Advanced TCA, PICMG 3.0 Short Form Specification, PCI Industrial Computers Manufacturers Group (PICMG), (Jan. 2003),33 pages.
AMC PICMG AMC.0, Advanced Mezzanine Card Short Form Specification, Version D0.9a,(Jun. 15, 2004),57 pages.
PCI Express Base Specification Revision 1.0, PCI Express, Table of Contents ( Jul. 22, 2002), 15 pgs.

* cited by examiner

*Primary Examiner*—Brian M Healy
(74) *Attorney, Agent, or Firm*—Grossman, Tucker, Perreault & Pfleger, PLLC

(57) ABSTRACT

An apparatus and system includes a radiation generation device for generating radiation and a radiation detection device. A first radiation channel is optically-coupled on a first end to the radiation generation device and configured to direct the radiation generated by the radiation generation device to a second end of the first radiation channel. A second radiation channel is optically-coupled on a first end to the radiation detection device and configured to direct radiation from a second end of the second radiation channel to the radiation detection device. An optical switch is configured to selectively interrupt the transmission of radiation from the second end of the first radiation channel to the second end of the second radiation channel.

22 Claims, 5 Drawing Sheets

US 7,450,796 B2

RADIATION SWITCH

FIELD OF THE DISCLOSURE

This disclosure relates to radiation switches and, more particularly, to radiation switches for use with AMC carrier cards.

BACKGROUND

In computer systems, computer component cards may be connected to a carrier card that plugs into a computer bus. An AMC (i.e., Advanced Mezzanine Card) is a high-speed, hot-swappable mezzanine card that is compatible with ATCA (i.e., Advanced Telecommunications Computing Architecture) carrier cards. The AMC standard is designed to enhance modularity and high-speed connectivity for ATCA and other platforms. AMC cards may be coupled to a computer bus using a high speed interconnect standard, such as the Peripheral Component Interconnect (PCI) Express™ Base Specification Revision 1.0, published 22 Jul. 2002 and available from the PCI Special Interest Group, Portland, Oreg., U.S.A. (hereinafter referred to as a "PCI Express™ bus").

PWB (i.e., Printed Wiring Board) extensions are often used to route circuit traces from the carrier card to a front panel of a computer enclosure so that information can be provided to and input received from a network administrator. This informational exchange is often required when hot-swapping computer components (e.g., computer cards and hard drives, for example).

DETAILED DESCRIPTION OF THE PREFERRED EMBODIMENTS

Figure 1:
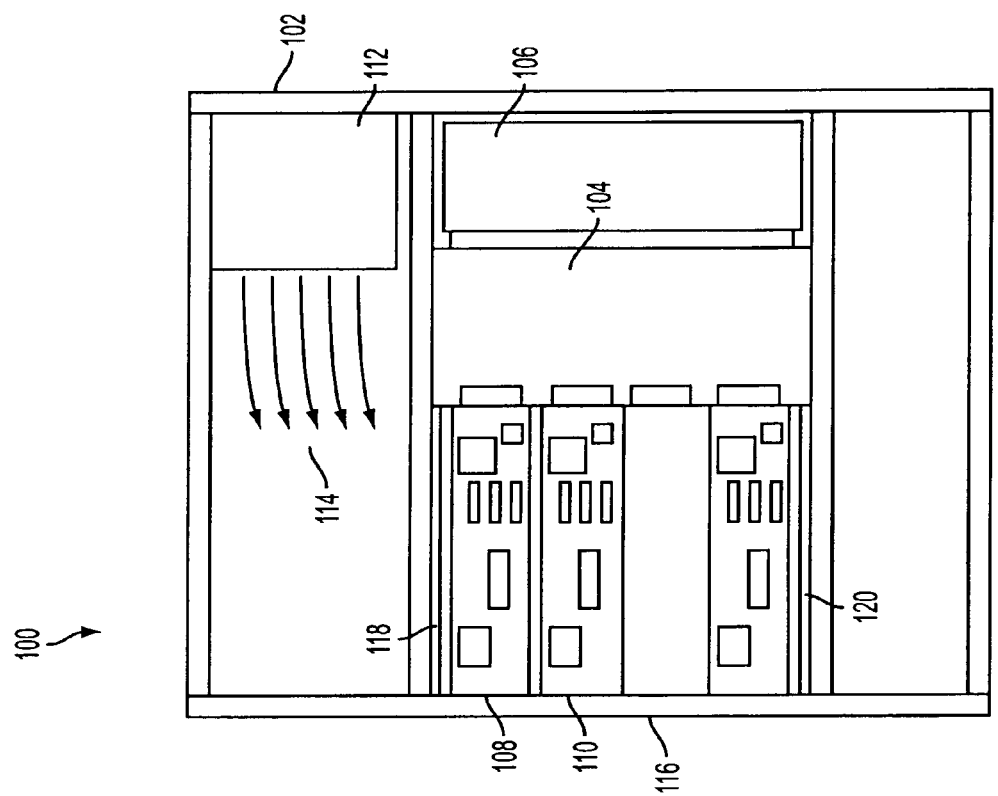
FIG. 1 is a diagrammatic view of a computing system including a circuit board and multiple circuit cards.

Referring to FIG. 1, there is shown a computing system 100. Computing system 100 may include a chassis 102 housing one or more circuit boards 104, such that circuit board 104 may be at least partially disposed within chassis 102. Circuit board 104 may be mechanically and/or electrically coupled to chassis 102 and various other circuit boards (e.g., circuit board 106) included within chassis 102. One or more smaller circuit boards (e.g., mezzanine cards 108, 110) may be electrically and/or physically coupled to circuit board 104. Cards 108, 110 may also include various components, such as a processors, memory modules, buses, and controllers, for example.

Computing system 100 may additionally include one or more fans 112 associated with a cooling system. Fan 112 may produce an air flow 114 through chassis 102 and provide convective cooling for circuit boards 104, 106, cards 108, 110 and/or other components disposed within chassis 102.

According to an embodiment of this disclosure, chassis 102 may be an ATCA (i.e., Advanced Telecommunications Computing Architecture) chassis, complying/compatible with the PCI Industrial Computer Manufacturers Group (PICMG), rev. 3.0, Advanced Telecommunications Computing Architecture (ATCA), published Dec. 30, 2002.

Figure 2:
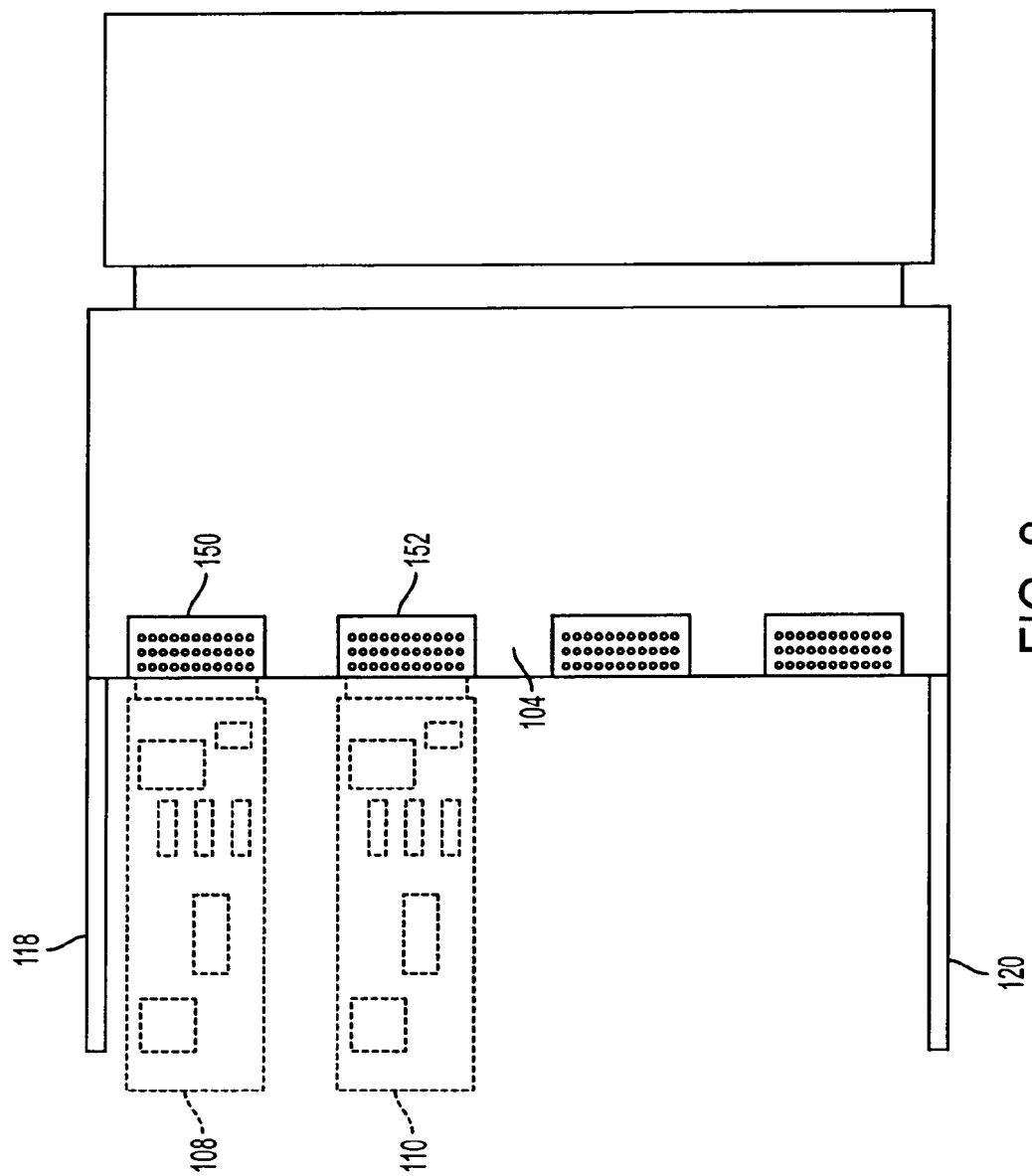
FIG. 2 is a more-detailed diagrammatic view of the circuit board of FIG. 1.
Figure 3:
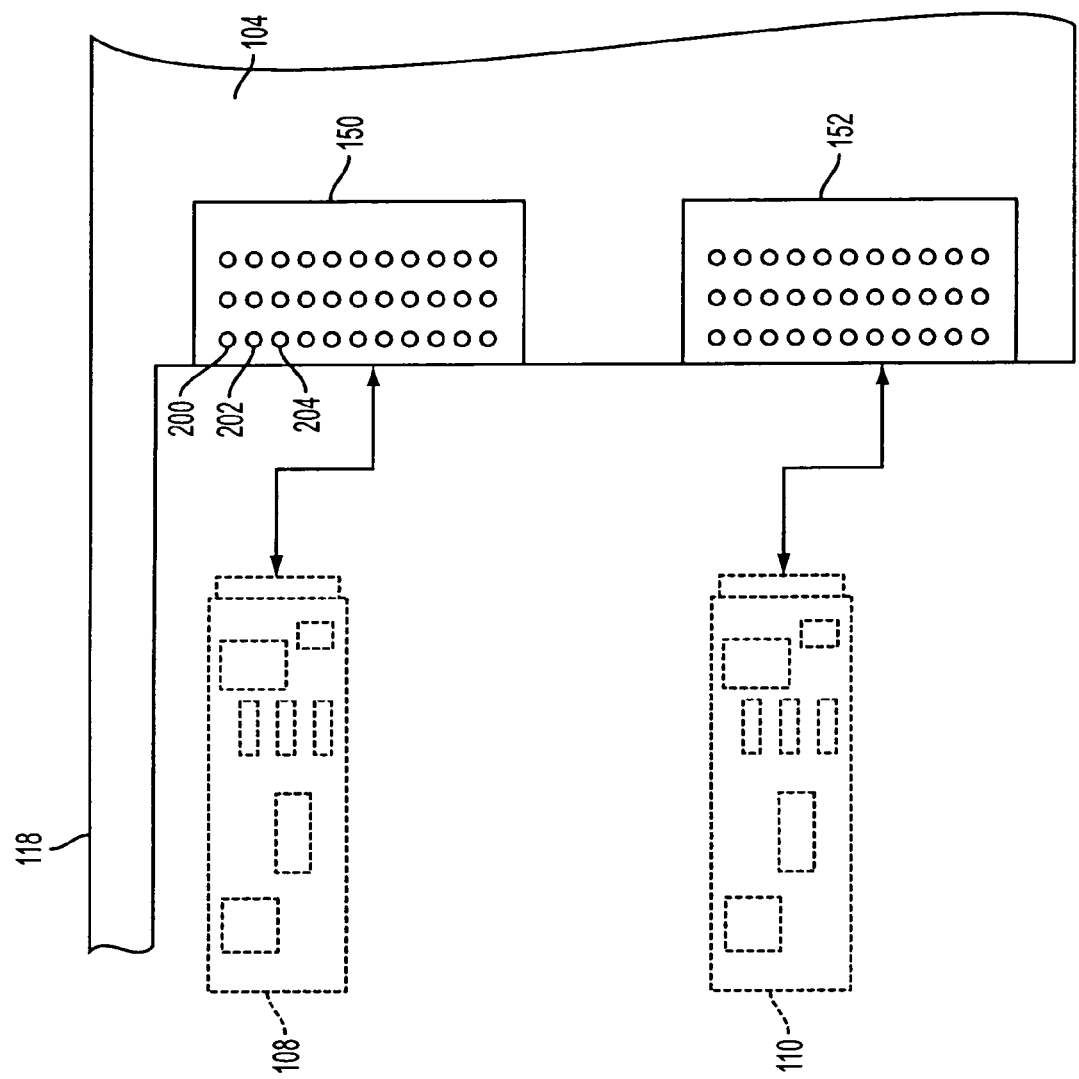
FIG. 3 is a diagrammatic view of connector footprints of the circuit board of FIG. 1.

Referring also to FIGS. 2 & 3, an embodiment of a circuit board 104 is shown. As discussed above, circuit board 104 may be capable of being electrically and/or mechanically coupled to one or more cards (e.g., mezzanine cards 108, 110, shown in phantom). Accordingly, circuit board 104 may include one or more card connector footprints 150, 152. Each connector footprint 150, 152 may include a plurality of electrical contacts 200, 202, 204, generally capable of being electrically coupled to a connector portion (to be discussed below) incorporated into cards 108, 110. Each of the plurality of electrical contacts 200, 202, 204 included within connector footprint 150, 152 may be provided as a landing pad (i.e., a conductive pad disposed and/or exposed on the surface of circuit board 104. In various alternative embodiments, electrical contacts 200, 202, 204 may be provided as plated through holes and/or other features known for electrically coupling components to a circuit board.

According to an embodiment of this disclosure, circuit board 104 may be configured to be electrically coupled to an AMC (i.e., Advanced Mezzanine Card) complying with and/or compatible with the PCI Industrial Computer Manufacturers Group (PICMG), Advanced Mezzanine Card (AMC) Base Specification, PICMG AMC.0, published Jan. 3, 2005 (the "AMC Specification"). As such, connector footprint 150 and electrical contacts 200, 202, 204 may be configured to be electrically coupled to an AMC connector, such as a Basic B connector, AB connector, an Extended B+ connector, or an A+B+ connector.

According to an embodiment of this disclosure, circuit board 104 may be configured to be coupled to various cards in addition to cards complying with and/or compatible with the AMC Specification. Accordingly, the number of electrical contacts and the arrangement of the electrical contacts within footprints 150, 150 may vary to comply with the appropriate technical specifications for the particular circuit board and/or for the particular card.

Figure 4:
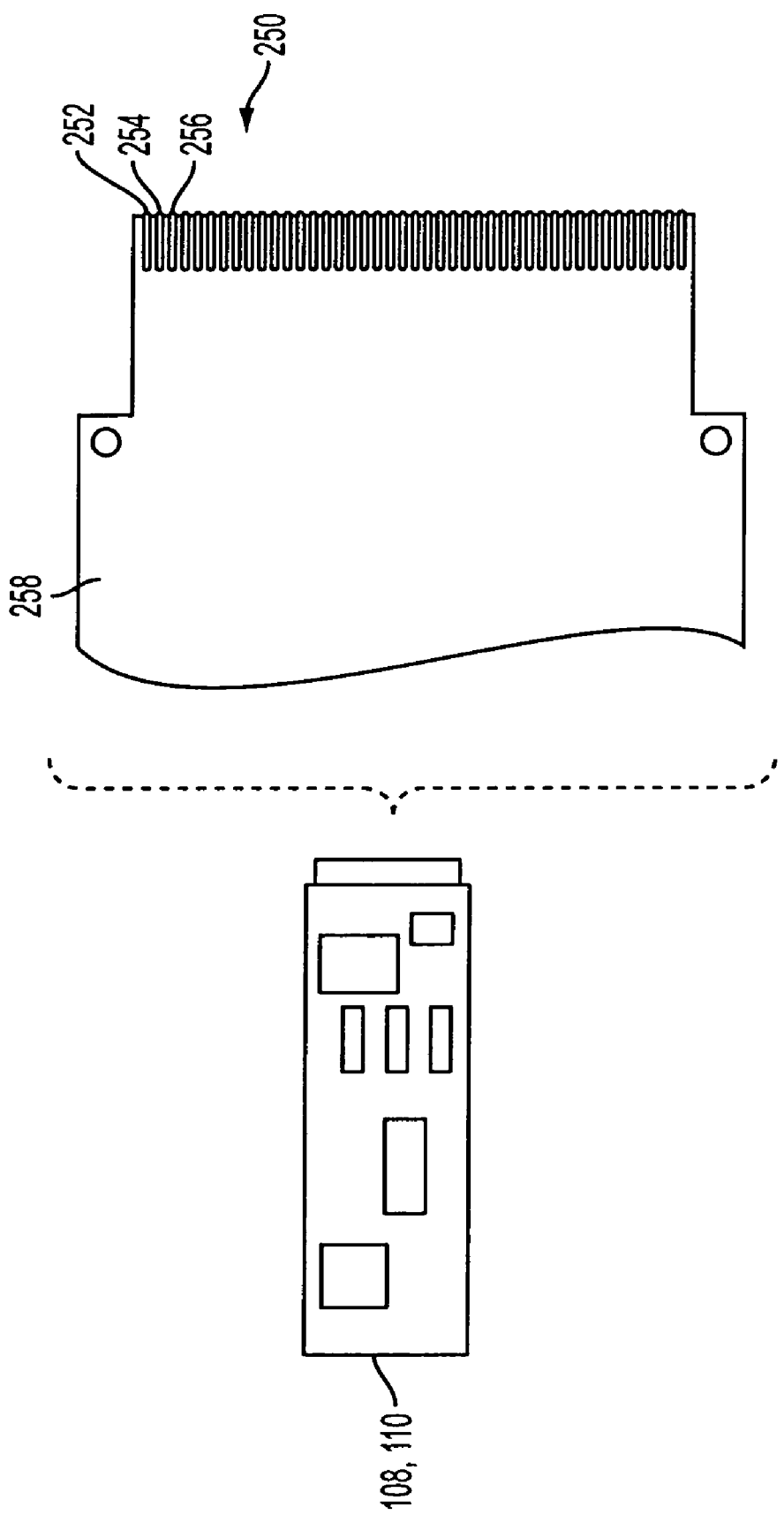
FIG. 4 is a diagrammatic view of the connector portion of the circuit cards of FIG. 1.

Referring also to FIG. 4, connector portion 250 of card 108, 110 is shown. As discussed above, card 108, 110 may be capable of being coupled to circuit board 104. Card 108, 110 may include various components, such as e.g., processors, memory modules, buses, and controllers, that may interact with one or more components incorporated into and/or associated with circuit board 104. Further, one or more of the components incorporated into and/or associated with card 108, 110 may be coupled to computing system 100 via circuit board 104.

In an embodiment, the connector portion 250 of card 108 may include a plurality of conductive traces 252, 254, 256. Conductive traces 252, 254, 256 may include e.g., metallic regions exposed on surface 258 of card 108, 110. Conductive traces 252, 254, 256 may be capable of providing electrical connections between components and/or circuits of card 108, 110 and circuit board 104/computing system 100. The size, number, and location of conductive traces 252, 254, 256 may be provided in accordance with the relevant technical specification for card 108, 110. The illustrated embodiment depicts a plurality of conductive traces disposed on a single surface 258 of card 108, 110. Additionally or alternatively, card 108, 110 may include a plurality of conductive traces disposed on the other surface (not shown) of card 108, 110.

According to an embodiment, card 108, 110 may be configured in accordance with the AMC Specification. As such, connector portion 250 and conductive traces 252, 254, 256 may be configured to be electrically coupled to an AMC connector footprint, such as a Basic B connector, AB connector, an Extended B+ connector, or an A+B+ connector. Consistent with the AMC Specification, conductive traces 252, 254, 256 may be provided to permit hot-swappable installation and/or removal of card 108, 110 from circuit board 104.

Referring again to FIG. 1, chassis 102 may include a faceplate 116, on which card 104 may display information and receive input signals concerning the status of card 104. This information may be provided through the use of e.g., LEDs (i.e., light emitting diodes). Additionally, the input signals may be provided via a switch assembly, such that the switch assembly is settable through face plate 116 of chassis 102.

Specifically and as discussed above, cards 108, 110 may be hot-swappable. Further, circuit board 104 may also be hot-swappable. To eliminate the need to hardwire (via foil circuit traces on a circuit board) card 104 to the LEDs viewable and switches operable through faceplate 116, one or more radiation channels 118, 120 may be used.

Figure 5:
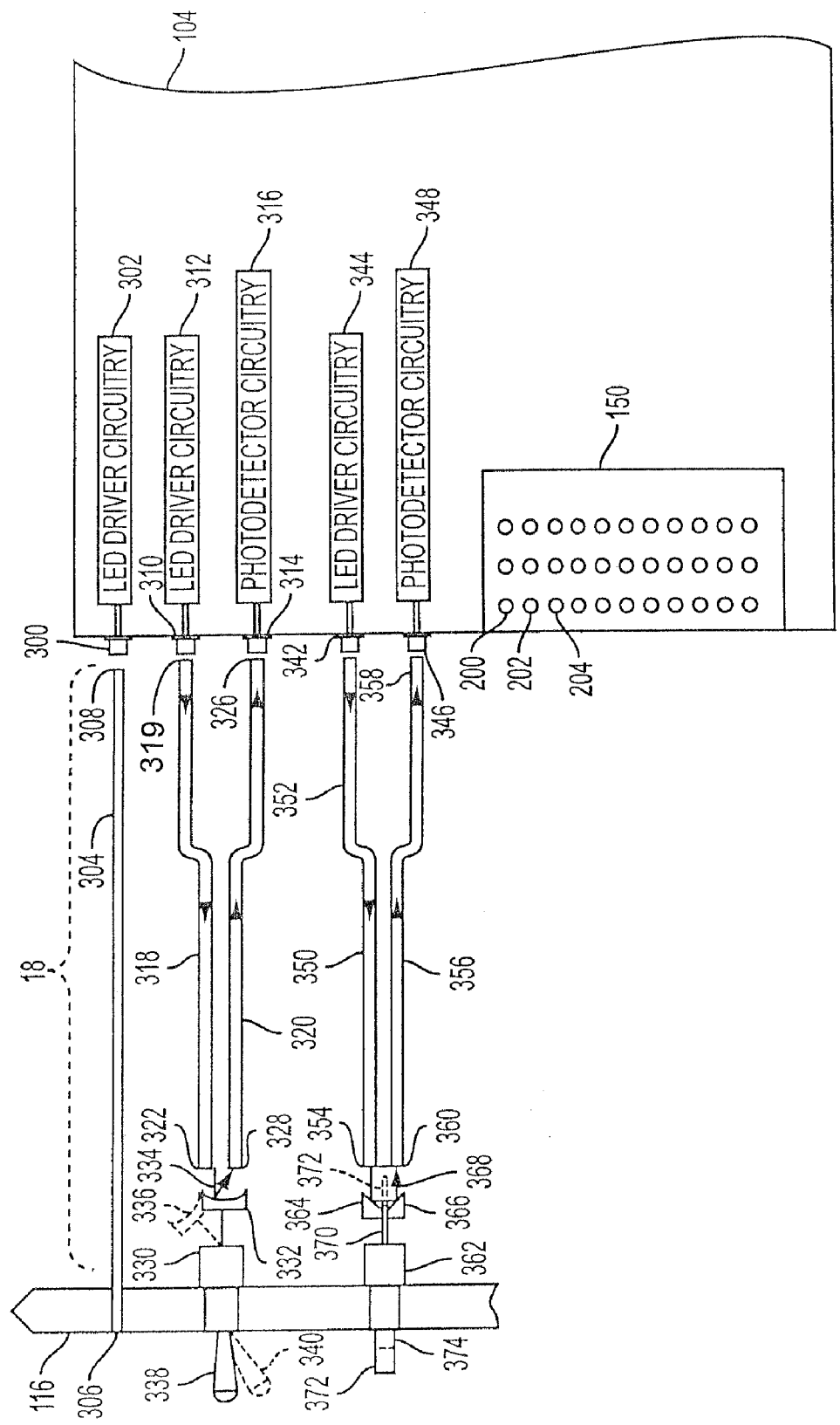
FIG. 5 is a diagrammatic view of radiation channels of the circuit board of FIG. 1.

Referring also to FIG. 5, which illustrates a diagrammatic view of radiation channels (generally referenced at 18) configured in accordance with an embodiment, if card 104 is to provide an LED-based signal though faceplate 116, an LED 300 (i.e., a radiation generation device) and the required LED driver circuitry 302 may be mounted on card 104. Radiation channel 304, having a first end 306 that penetrates faceplate 116 and a second end 308 optically-coupled to LED 300, may be used to transfer the radiation (e.g., light energy) emitted by LED 300 through faceplate 116.

Examples of radiation channel 304 may include light pipes (e.g., rigid plastic tubes that conduct light), optical fibers (e.g., flexible fibers that conduct light), and focusing objects (e.g., one or more lenses that focus the radiation emitted by LED 300 onto a lens (not shown) included within faceplate 116.

If card 104 is to receive an input signal from a switch mounted on faceplate 116, an LED 310 (i.e., a radiation generation device), the required LED driver circuitry 312, a photodetector 314 (i.e., a radiation detection device), and the required photodetector circuitry 316 may be mounted on card 104. A first radiation channel 318 may be optically-coupled (on a first end 319) to LED 310 and may direct the radiation (i.e., light energy) emitted by LED 310 to a second end 322 of first radiation channel 318. A second radiation channel 320 may be optically-coupled (on a first end 326) to photodetector 314 and may direct radiation from a second end 328 of second radiation channel 320 to photodetector 314.

An optical switch 330 may be configured to selectively interrupt the transmission of radiation from the second end 322 of the first radiation channel 318 to the second end 328 of the second radiation channel 320. In this particular embodiment, optical switch 330 may include reflective portion 332 that, when properly positioned, reflects radiation from the second end 322 of the first radiation channel 318 to the second end 328 of the second radiation channel 320 (as shown with arrow 334). However, when reflective portion 332 is in position 336 (shown in phantom), the transmission of radiation from the second end 322 of the first radiation channel 318 to the second end 328 of the second radiation channel 320 may be interrupted. The position of reflective portion 332 may be controlled via the position of e.g., lever 338. Accordingly, when lever 338 is in position 340 (shown in phantom), reflective portion 332 may be in position 336, thus interrupting the transmission of radiation from the second end 322 of the first radiation channel 318 to the second end 328 of the second radiation channel 320. Accordingly. the position of switch 330 may be determined by monitoring the signal received by photodetector circuitry 316.

Examples of radiation channels 318, 320 may include light pipes (e.g., rigid plastic tubes that conduct light), and optical fibers (e.g., flexible fibers that conduct light).

If card 104 is to receive an input signal from a switch mounted on faceplate 116, in another embodiment of the disclosure, an LED 342 (i.e., a radiation generation device), the required LED driver circuitry 344, a photodetector 346 (i.e., a radiation detection device), and the required photodetector circuitry 348 may be mounted on card 104. A first radiation channel 350 may be optically-coupled (on a first end 352) to LED 342 and direct the radiation (i.e., light energy) emitted by LED 342 to a second end 354 of first radiation channel 350. A second radiation channel 356 may be optically-coupled (on a first end 358) to photodetector 346 and direct radiation from a second end 360 of second radiation channel 356 to photodetector 346.

An optical switch 362 may be configured to selectively interrupt the transmission of radiation from the second end 354 of the first radiation channel 350 to the second end 360 of the second radiation channel 356. In this particular embodiment, optical switch 362 includes a first reflective device 364 and a second reflective device 366 that, in combination, reflect radiation from the second end 354 of the first radiation channel 350 to the second end 360 of the second radiation channel 356 (as shown with arrow 368).

Switch 362 may include an opaque portion 370 selectively positionable between first reflective device 364 and a second reflective device 366 and, therefore, between the second end 354 of the first radiation channel 350 to the second end 360 of the second radiation channel 356. When opaque portion is in position 372 (shown in phantom), the transmission of radiation from the second end 354 of the first radiation channel 350 to the second end 360 of the second radiation channel 356 may be interrupted. The position of opaque portion 370 may be controlled via the position of e.g., button 372. Accordingly, when button 372 is in position 374 (shown in phantom), opaque portion 370 is in position 372, thus interrupting the transmission of radiation from the second end 354 of the first radiation channel 350 to the second end 360 of the second radiation channel 356. Accordingly. the position of switch 362 may be determined by monitoring the signal received by photodetector circuitry 348.

Examples of radiation channels 350, 356 may include light pipes (e.g., rigid plastic tubes that conduct light), and optical fibers (e.g., flexible fibers that conduct light).

A number of implementations have been described. Nevertheless, it will be understood that various modifications may be made. Accordingly, other implementations are within the scope of the following claims.

What is claimed is:

1. An apparatus for optically coupling a front panel assembly to a carrier card operatively coupled to a computer system bus, the apparatus comprising:
   a first radiation channel for optically coupling on a first end to a radiation generation device and configured to direct the radiation generated by the radiation generation device to a second end of the first radiation channel;
   a second radiation channel for optically coupling on a first end to a radiation detection device and configured to direct radiation from a second end of the second radiation channel to the radiation detection device; and
   an optical switch controllable from the front panel and being configured to selectively interrupt the transmission of radiation from the second end of the first radiation channel to the second end of the second radiation channel;

wherein the apparatus is configured to releasably engage one or more of a plurality of electrical contacts within the carrier card.

2. The apparatus of claim 1 wherein the radiation generation device is a light emitting diode, and the radiation detection device is a photodetector, and both the radiation generation device and the radiation detection device are mounted on the carrier card.

3. The apparatus of claim 1 wherein the first and second radiation channels include light pipes.

4. The apparatus of claim 1 wherein the first and second radiation channels include optical fibers.

5. An apparatus for optically coupling a front panel assembly to a carrier card operatively coupled to a computer system bus, the apparatus comprising:
  a circuit card configured to releasably engage one or more of a plurality of electrical contacts within the carrier card, the circuit card including:
    a first radiation channel for optically coupling on a first end to
  a radiation generation device and configured to direct the radiation generated by the radiation generation device to a second end of the first radiation channel;
    a second radiation channel for optically coupling on a first end to a radiation detection device and configured to direct radiation from a second end of the second radiation channel to the radiation detection device; and
  an optical switch controllable from the front panel and being configured to selectively interrupt the transmission of radiation from the second end of the first radiation channel to the second end of the second radiation channel.

6. The apparatus of claim 5 wherein the carrier card is an AMC carrier card.

7. The apparatus of claim 5 wherein the radiation generation device is a light emitting diode, and the radiation detection device is a photodetector.

8. The apparatus of claim 5 wherein the first and second radiation channels include light pipes.

9. The apparatus of claim 5 wherein the first and second radiation channels include optical fibers.

10. The apparatus of claim 5 wherein the optical switch includes:
  a reflective portion selectively positionable proximate the second end of the first radiation channel and the second end of the second radiation channel, and configured to selectively reflect radiation from the second end of the first radiation channel to the second end of the second radiation channel.

11. The apparatus of claim 5 wherein the optical switch includes:
  a opaque portion selectively positionable between the second end of the first radiation channel and the second end of the second radiation channel, and configured to selectively interrupt the transmission of radiation from the second end of the first radiation channel to the second end of the second radiation channel.

12. A method for optically coupling a front panel assembly to a carrier card operatively coupled to a computer system bus, the method comprising:
  optically-coupling a first end of a first radiation channel to a radiation generation device, wherein the first radiation channel is configured to direct the radiation generated by the radiation generation device to a second end of the first radiation channel;
  optically-coupling a first end of a second radiation channel to a radiation detection device, wherein the second radiation channel is configured to direct radiation from a second end of the second radiation channel to the radiation detection device; and
  providing an optical switch controllable from the front panel and being configured to selectively interrupt the transmission of radiation from the second end of the first radiation channel to the second end of the second radiation channel.

13. The method of claim 12 wherein the radiation generation device is a light emitting diode, and the radiation detection device is a photodetector.

14. The method of claim 12 wherein the first and second radiation channels include light pipes.

15. The method of claim 12 wherein the first and second radiation channels include optical fibers.

16. A system comprising:
  an ATCA chassis;
  an AMC including a plurality of electrical contacts;
  a circuit board capable of being at least partially disposed within the ATCA chassis, the circuit board including a connector footprint configured to engage one of more of the plurality of electrical contacts, the circuit board further including:
    a first radiation channel optically-coupled on a first end toa radiation generation device and configured to direct the radiation generated by the radiation generation device to a second end of the first radiation channel;
    a second radiation channel optically-coupled on a first end to a radiation detection device and configured to direct radiation from a second end of the second radiation channel to the radiation detection device; and
  an optical switch being configured to selectively interrupt the transmission of radiation from the second end of the first radiation channel to the second end of the second radiation channel.

17. The system of claim 16 wherein the circuit board is an AMC carrier card.

18. The system of claim 16 wherein the radiation generation device is a light emitting diode, and the radiation detection device is a photodetector.

19. The system of claim 16 wherein the first and second radiation channels include light pipes.

20. The system of claim 16 wherein the first and second radiation channels include optical fibers.

21. The system of claim 16 wherein the optical switch includes:
  a reflective portion selectively positionable proximate the second end of the first radiation channel to the second end of the second radiation channel, and configured to selectively reflect radiation from the second end of the first radiation channel to the second end of the second radiation channel.

22. The system of claim 16 wherein the optical switch includes:
  a opaque portion selectively positionable between the second end of the first radiation channel and the second end of the second radiation channel, and configured to selectively interrupt the transmission of radiation from the second end of the first radiation channel to the second end of the second radiation channel.

* * * * *